US005795647A

United States Patent [19]

Robinson et al.

[11] Patent Number: 5,795,647

[45] Date of Patent: Aug. 18, 1998

[54] PRINTING PLATE HAVING IMPROVED WEAR RESISTANCE

[75] Inventors: Edward C. Robinson; Robert E. Bombalski, both of New Kensington; Thomas L. Levendusky, Greensburg; Jean Ann Skiles, Gibsonia; Mark L. Weaver, Allison Park; Nickolas C. Kotow, Bethel Park, all of Pa.

[73] Assignee: Aluminum Company of America, Pittsburgh, Pa.

[21] Appl. No.: 712,528

[22] Filed: Sep. 11, 1996

[51] Int. Cl.$^{6}$ .................... G03F 7/00; B32B 5/16; B05D 1/36; B05D 3/12

[52] U.S. Cl. .................... 428/329; 427/202; 427/205; 427/419.1; 427/419.5; 427/198; 430/302; 428/147; 428/148; 428/337; 428/339; 428/341

[58] Field of Search .................... 427/194, 202, 427/199, 198, 205, 419.2, 419.5; 430/302

[56] References Cited

U.S. PATENT DOCUMENTS

| | | | |
|---|---|---|---|
| 3,085,025 | 4/1963 | Eaton | 427/198 |
| 3,330,695 | 7/1967 | Curran . | |
| 3,649,268 | 3/1972 | Chu et al. | 96/27 R |
| 3,652,317 | 3/1972 | Della Porta et al. | 427/194 |
| 3,708,321 | 1/1973 | Spieles | 427/470 |
| 3,975,197 | 8/1976 | Mikelsons | 96/86 |
| 4,138,511 | 2/1979 | Rolles et al. | 427/195 |
| 4,139,518 | 2/1979 | Janocha et al. | 260/40 R |
| 4,148,955 | 4/1979 | Breitenfellner et al. | 264/184 |
| 4,168,979 | 9/1979 | Okishi et al. | 96/75 |
| 4,229,518 | 10/1980 | Gray et al. | 430/273 |
| 4,238,560 | 12/1980 | Nakamura et al. | 430/162 |
| 4,288,521 | 9/1981 | Kojima et al. | 427/194 |
| 4,352,847 | 10/1982 | Okiyama | 428/141 |
| 4,430,403 | 2/1984 | Westdale et al. | 430/302 |
| 4,559,292 | 12/1985 | Geissler et al. | 430/256 |
| 4,604,340 | 8/1986 | Grossa | 430/270 |
| 4,737,446 | 4/1988 | Cohen et al. | 427/98 |
| 4,859,571 | 8/1989 | Cohen et al. | 427/302 |
| 4,958,562 | 9/1990 | Lewis et al. | 101/457 |
| 5,052,292 | 10/1991 | Lewis et al. | 101/142 |
| 5,055,377 | 10/1991 | Littman et al. | 430/271 |
| 5,059,446 | 10/1991 | Winkle, Sr. et al. | 427/196 |
| 5,167,989 | 12/1992 | Dudek et al. | 427/202 |
| 5,213,920 | 5/1993 | Coppens et al. | 430/144 |
| 5,254,421 | 10/1993 | Coppens et al. | 427/259 |
| 5,407,702 | 4/1995 | Smith et al. | 427/211 |
| 5,520,956 | 5/1996 | Kieser et al. | 427/202 |

*Primary Examiner*—Diana Dudash
*Attorney, Agent, or Firm*—Glenn E. Klepac

[57] ABSTRACT

A printing plate is made by coating a metal substrate with a polymer layer having an outer surface, coating the polymer layer with solid particles having an average particle size of less than about 30 microns, and compressing the solid particles so that most of them are below the polymer layer outer surface. The solid particles are preferably alpha-alumina particles having an average size of about 1–10 microns. The printing plate has improved wear resistance.

19 Claims, 2 Drawing Sheets

PRINTING PLATE HAVING IMPROVED WEAR RESISTANCE

PENDING RELATED APPLICATION

This application is related to copending Robinson et al U.S. Ser. No. 08/559,670, filed Nov. 20, 1995, entitled "Lithographic Sheet Material Having a Thermoplastic Adhesive Layer".

FIELD OF THE INVENTION

The present invention relates to a printing plate suitable for flexographic printing or lithography. The printing plate of the invention includes a metal substrate coated with a polymer layer, and a coating of mineral or metal particles over the polymer layer for improved wear resistance.

BACKGROUND OF THE INVENTION

Prior art flexographic printing plates typically are made from thermoplastic or elastomeric polymers having a thickness of about 0.007 to 0.060 inch. Although these prior art plates perform adequately, there are two drawbacks in the current technology. The polymers are soft substances which wear away when used. Accordingly, durability of the plates (measured by number of copies per plate) is dependent upon wear resistance of polymers in the plates. Secondly, there is a potential for damaging a polymer flexographic plate in the process of wrapping the plate around a cylindrical drum and attaching it to the drum for printing.

A principal objective of the present invention is to provide a printing plate suitable for flexographic printing and having improved resistance to surface wear.

A related objective of the invention is to provide a flexographic printing plate having improved resistance to damage when the plate is wrapped around a cylindrical drum and attached to the drum for printing.

Another objective of the invention is to provide a printing plate that is suitable for either flexographic printing or lithography.

Additional objectives and advantages of our invention will become apparent to persons skilled in the art from the following detailed description.

SUMMARY OF THE INVENTION

In accordance with our invention, there is provided a process for making a sheet material suitable for use as a printing plate. The sheet material is primarily intended for use in flexographic printing. The sheet material includes a metal substrate, a polymer layer coated onto the substrate, and a layer of mineral or metal particles compressed into the polymer layer so that most of the particles are below the polymer layer outer surface. Portions of some particles extend above the outer surface. On the polymer layer outer surface, the particles occupy greater surface area than the polymer.

The metal substrate may be aluminum or steel and is preferably an aluminum alloy of the AA 1000, 3000 or 5000 series. Aluminum alloys of the AA 5000 series containing about 0.5–10 wt. % magnesium are particularly preferred.

The metal substrate should have a thickness of about 5–20 mils, preferably about 6–12 mils. An AA 5182-H19 aluminum alloy substrate having a thickness of about 8.8 mils was utilized in a preferred embodiment.

The polymer layer may contain an elastomeric polymer or a thermoplastic polymer. Some suitable thermoplastics include polyvinyl chloride and the polyolefins, polycarbonates, polyamides and polyesters such as polyethylene terephthalate (PET). Some suitable elastomeric polymers include polybutadiene, polyether urethanes and poly (butadiene-co-acrylonitrile).

A preferred PET resin is a high melt viscosity (HMV) resin of the type which has heretofore been used to coat ovenable metal trays and food packaging foils. Selar® PT8307 HMV copolymer resin sold by E. I. Du Pont de Nemours Company is an example of a suitable PET resin. The copolymer may be used alone or in a blend with other thermoplastic polyesters. For example, a blend of Selar® PT8307 HMV copolymer with T89 PET sold by Hoechst-Celanese may provide satisfactory performance.

The polymer layer may be coated onto the metal substrate by any of several coating means including spraying, roll coating, dipping, electrocoating, powder coating, laminating and extrusion coating. In a particularly preferred embodiment, PET is extrusion coated onto one side of an aluminum alloy substrate at a coating thickness of about 13.0 mils (330 microns). The PET may be extrusion coated onto both sides of the substrate and its thickness should be at least about 6 mils (150 microns) on each side. When the sheet material is used for flexographic printing, a coating of PET having a thickness of about 8–30 mils (200–760 microns) on only one side is preferred.

The polymer layer is preferably loaded with particles of a white pigment to improve its opacity. Some preferred pigments include titanium dioxide, alumina, calcium carbonate, talc and mixtures thereof. The pigment should have an average particle size of about 10 microns or less, preferably about 1 micron or less. The pigment loading should be about 1–20 wt. %, preferably about 2–10 wt. %. A preferred PET polymer layer contains about 5.4 wt. % titanium dioxide particles having an average particle size of about 0.2–0.3 microns.

The pigmented polymer layer is preferably extrusion coated onto one side of an aluminum alloy sheet by heating the sheet, extruding pigmented PET onto one side while it is at a temperature of at least about 400° F. (204° C.), heating the coated sheet to at least the glass transition temperature of the PET, and then cooling the coated sheet. The extrusion die is positioned about 10–200 mm away from the sheet. The sheet travels about 10–20 times faster than extrudate flowing from the extrusion die, so that the extrudate is reduced in thickness by pull of the metal sheet. The molten polymer impinges upon the metal sheet surface almost immediately after exiting the die, so that the polymer has no opportunity to cool before it is applied. A uniform coating is thereby ensured over the sheet surface.

Additional details of the particularly preferred extrusion coating process are revealed in Smith et al U.S. Pat. No. 5,407,702. The disclosure of the Smith et al patent is incorporated herein, to the extent consistent with the present invention.

The polymer layer is reheated to a temperature near its melting temperature in order to facilitate contact with particles. When the polymer layer is PET having a melting point of about 450° F. (232° C.), the coated sheet is preferably heated to about 435–465° F. and more preferably about 440–460° F. The polymer layer is preferably heated to within about 10° F. (6° C.) of its melting point before the particle coating is applied.

The mineral or metal particles applied to the polymer layer may be alumina, silica, magnesia, titania, zinc oxide, aluminum or zinc. The particles have an average particle size of less than about 30 microns, preferably about 0.5–20 microns and more preferably about 1–10 microns. Alumina, silica and titania particles are preferred. The particles are most preferably alpha-alumina particles having an average size of about 1.2 microns.

The particles are coated onto an outer surface of the polymer layer spaced from the metal substrate while the polymer layer is at a temperature near its melting temperature. The particles are then compressed so that most of them are below the polymer layer outer surface. In a particularly preferred embodiment, a flat metal plate applied to the particles at a pressure of approximately 0.12 psi compressed the particles adequately. After the particles are compressed, the sheet is cooled so that the particles are trapped in the polymer layer with portions of some particles extending above the outer surface.

The particles make up about 1–50 wt. % of the product, based upon the combined weight of polymer and particles. More preferably, the particles comprise about 2–30 wt. % of the combined weight. After the particles are compressed, the particle layer may have a thickness of about 0.1–10 mils (2.5–254 microns), preferably about 0.2–1 mil (5–25 microns).

DETAILED DESCRIPTION OF A PREFERRED EMBODIMENT

Figure 1:
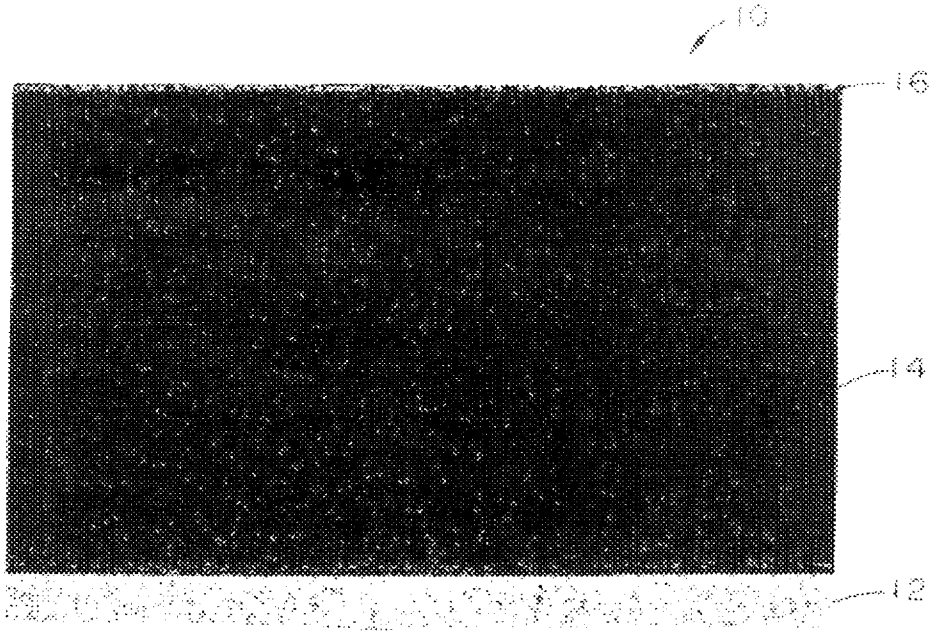
FIG. 1 is a cross-sectional view of a first printing plate of the invention, as seen by scanning electron microscopy (SEM).

In accordance with the present invention, two samples of an aluminum alloy substrate were coated with a polymer layer and alpha-alumina particles. The substrate was an AA 5182-H19 aluminum alloy sheet having a thickness of about 8.8 mils (224 microns). The aluminum substrate was coated with Selar® PT 8307 HMV polyethylene terephthalate by extrusion coating. The coating thickness was 13.0 mils (330 microns).

The coated sheet was reheated to a temperature of 450° F. and a coating of alpha-alumina particles (1.2 microns average size) was applied by two different methods. Particles brush-coated onto the polymer outer surface produced a particle layer having a thickness of about 0.123 mils (3.12 microns). The particle loading was sufficient to form a layer having a thickness about 1% of the polymer layer thickness.

As shown in FIG. 1, the printing plate 10 includes an aluminum alloy substrate 12, a polymer layer 14 having a coating thickness of about 13.0 mils and an alpha-alumina particle layer 16 having a thickness of about 0.123 mils. A second sample was prepared by compressing alpha-alumina particles into the polymer outer surface while the coated sheet was heated to 450° F. A flat metal pressure plate applied about 0.12 psi to the particles. The compressed particle layer had a thickness of 0.507 mils (12.9 microns). The particle loading was sufficient to form a layer having a thickness about 4% of the polymer layer thickness.

Figure 2:
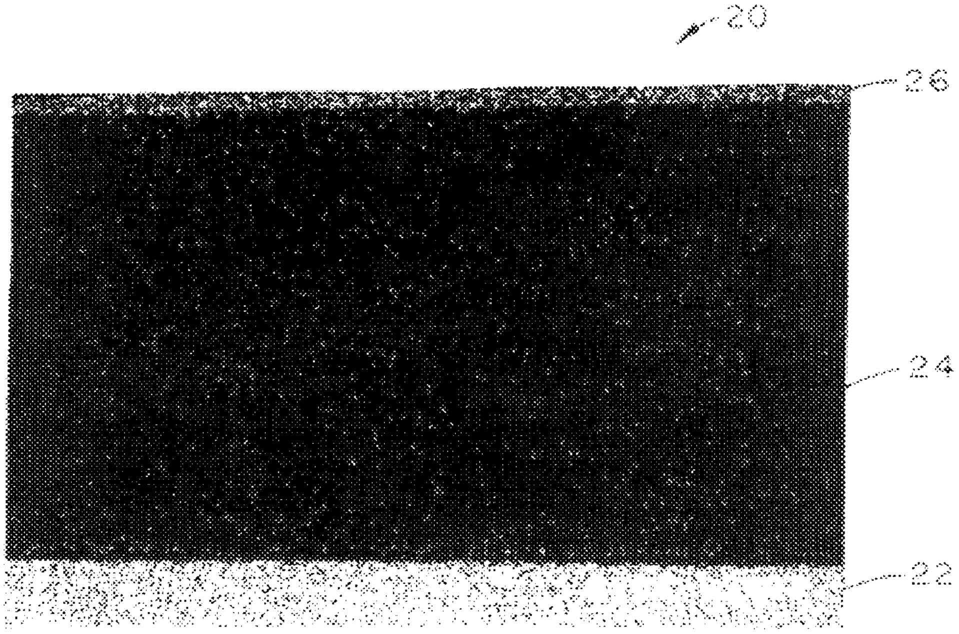
FIG. 2 is a cross-sectional view of a second printing plate of the invention, as seen by scanning electron microscopy (SEM).

A second printing plate 20 made by the process of the invention is shown in FIG. 2. The printing plate 20 includes an aluminum alloy substrate 22, a polymer layer 24 having a coating thickness of about 13.0 mils and an alpha-alumina particle layer 26 having a thickness of about 0.507 mils.

Figure 3:
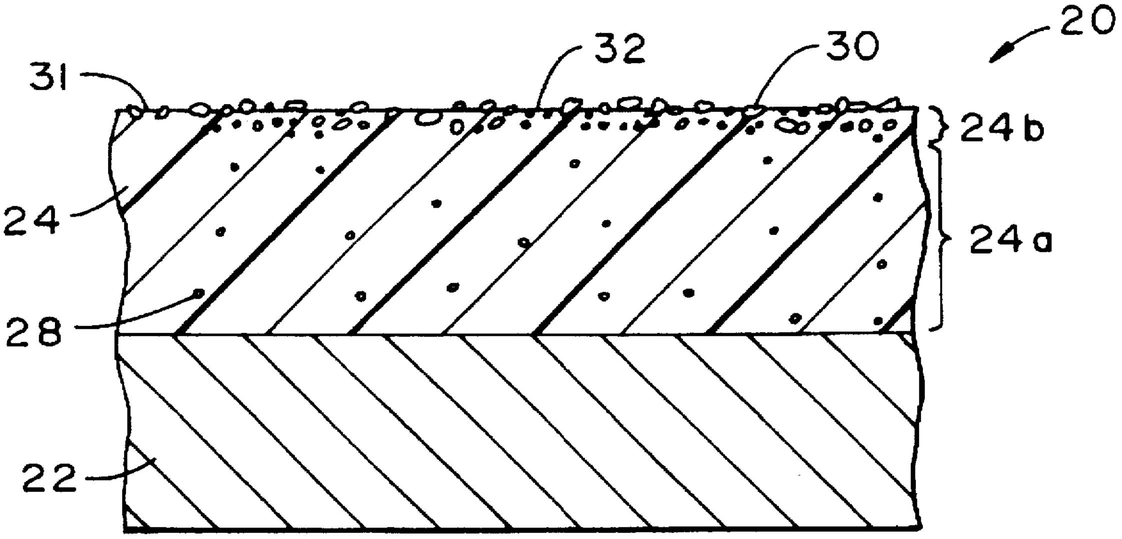
FIG. 3 is a schematic, cross-sectional view of the second printing plate 20.

Referring now to FIG. 3, the polymer layer 24 includes an inner zone 24*a* containing relatively few solid particles 28 and an outer zone 24*b* filled with alpha-alumina particles 30. The outer zone 24*b* extends between the inner zone 24*a* and the polymer layer outer surface 31. Portions of some alpha-alumina particles 30 extend outwardly from the outer surface 31. Some areas of free space 32 on the outer surface 31 have no exposed particles.

Samples of sheet materials with the brushed-on particle layer and with the compressed particle layer were examined for surface characteristics by SEM/IBAS. The SEM/IBAS analysis is a technique to image the particles of the surface with an electron microscope, utilizing both a detector and software to measure particle density, particle size and free space area. The free space area represents portions of the polymer layer outer surface that are not covered by particles. Results are shown in the following Table.

| Particle Layer Application | Percent Area Particles | Particle Size | Percent Area Free Space | Free Space Size |
|---|---|---|---|---|
| Brush Only | 36.14 | 0.53 | 17.65 | 4.15 |
| Pressure Plate | 33.3 | 1.06 | 29.43 | 4.32 |

The foregoing detailed description of our invention has been made with reference to a particularly preferred embodiment. Persons skilled in the art will understand that numerous changes and modifications can be made without departing from the spirit and scope of the following claims.

What is claimed is:

1. A process for making a sheet material suitable for use as a printing plate, comprising:

(a) providing a metal substrate comprising an aluminum alloy or steel sheet having a thickness of about 5–20 mils;

(b) coating said metal substrate with a polymer layer comprising a thermoplastic or elastomeric polymer, said polymer layer including an outer surface spaced from said metal substrate and wherein the polymer layer is ticker than the metal substrate;

(c) maintaining said polymer layer within about 15° F. above or below its melting point;

(d) while maintaining said polymer layer within about 15° F. of its melting point, coating said polymer layer with a plurality of mineral or metal particles having an average particle size of less than about 30 microns; and (e) compressing said particles into said polymer layer so that most of said particles are below said outer surface and portions of some of said particles extend outwardly of said outer surface.

2. The process of claim 1 wherein said substrate comprises an aluminum alloy of the AA 1000, 3000 or 5000 series.

3. The process of claim 1 wherein said polymer layer comprises a polymer selected from the group consisting of polyesters, polyolefins, acrylics, polyamides, polycarbonates, polyvinyl chlorides and mixtures thereof.

4. The process of claim 1 wherein step (b) comprises extrusion coating said metal substrate with a polymer layer comprising polyethylene terephthalate.

5. The process of claim 1 where in said polymer layer comprises polyethylene terephthalate and has a thickness of about 8–30 mils.

6. The process of claim 1 wherein said polymer layer comprises polyethylene terephthalate having a melting point of about 450° F. and step (c) comprises maintaining said polymer layer at a temperature of about 440–460° F.

7. The process of claim 1 wherein said particles comprise alumina, silica, zinc oxide, magnesia, aluminum or zinc.

8. The process of claim 1 wherein said particles comprise alumina and have an average size of about 1–10 microns.

9. The process of claim 1 wherein said particles comprise about 1–50 wt. % of said polymer layer after step (e).

10. The process of claim 1 further comprising:

(f) cooling said sheet material, thereby to trap said particles in said polymer layer.

11. The process of claim 1 wherein said particles are alpha-alumina particles.

12. The process of claim 1 wherein said particles occupy greater surface area than said polymer on the polymer layer outer surface.

13. A sheet material suitable for use as a printing plate having improved wear resistance, said sheet material being made by the process of claim 1.

14. The sheet material of claim 13 wherein said substrate comprises an aluminum alloy, said polymer layer comprises polyethylene terephthalate and said particles comprise alumina.

15. The sheet material of claim 14 wherein said particles are alpha-alumina particles having an average particle size of about 1–10 microns.

16. The process of claim 1 wherein step (c) comprises maintaining said polymer layer within about 10° F. above or below its melting point.

17. The process of claim 1 wherein said polymer layer comprises a single layer.

18. A process for making a sheet material suitable for use as a printing plate, comprising:

(a) providing a metal substrate having a thickness of about 5–20 mils and comprising an aluminum alloy;

(b) coating said metal substrate with a single polymer layer having a thickness of about 8–30 mils and comprising polyethylene terephthalate, said polymer layer being thicker than said metal substrate;

(c) maintaining said polymer layer within about 15° F. of its melting point;

(d) while maintaining said polymer layer within about 15° F. of its melting point, coating said polymer layer with alumina particles having an average particle size of less than about 30 microns;

(e) compressing said alumina particles into said polymer layer so that most of said alumina particles are below said outer surface; and (f) cooling said sheet material, thereby to trap said alumina particles in said polymer layer.

19. The process of claim 18 comprising maintaining said polymer layer within about 10° F. of its melting point in steps (c) and (d).

* * * * *